United States Patent [19]
Huang

[11] Patent Number: 6,163,000
[45] Date of Patent: Dec. 19, 2000

[54] INSPECTING SORTING MACHINE FOR FINISHED PRODUCTS OF PLASTIC FILM CAPACITOR

[76] Inventor: Robert S. Huang, Chung Li, Taiwan

[21] Appl. No.: 09/293,918

[22] Filed: Apr. 19, 1999

[51] Int. Cl.[7] .................................................. B07C 5/344
[52] U.S. Cl. .......................... 209/574; 209/906; 209/919; 324/158.1; 324/755
[58] Field of Search ................................... 209/556, 571, 209/573, 574, 906, 919, 925; 324/158.1, 537, 754, 757, 755

[56] References Cited

U.S. PATENT DOCUMENTS

| | | | |
|---|---|---|---|
| 2,617,527 | 11/1952 | Smith | 209/574 X |
| 6,025,567 | 2/2000 | Brooks | 209/925 X |

FOREIGN PATENT DOCUMENTS

| | | | |
|---|---|---|---|
| 427611 | 5/1991 | European Pat. Off. | 209/574 |
| 1008932 | 3/1983 | U.S.S.R. | 209/574 |

*Primary Examiner*—Tuan N. Nguyen
*Attorney, Agent, or Firm*—Dougherty & Troxell

[57] ABSTRACT

An inspecting sorting machine for finished products of plastic film capacitor, includes a pneumatic pump, an automatic feeding table, a main inspecting machine, a central processing unit, a number of measuring gauges, a charging and discharging power supply and a motor transmission mechanism, the pneumatic pump is used with several pneumatic cylinders for a number of material-falling stations of the main inspecting machine to force capacitors to fall down, the automatic feeding table has at least two electromagnetic vibration type automatic feeding plates so that capacitors which are to be inspected are transported to a linear feeding unit of the inspecting main machine;

the main inspecting machine includes a feeding plate with four claws, a main testing plate, a fixture plate, a full foot mechanism, a predicting mechanism, an insulation impedance testing point and a high low frequency capacity consumption testing mechanism which are all driven by the motor transmission mechanism which is mounted behind the inspecting machine main; then after capacitors pass through the linear feeding unit and enter the feeding plate, a series of preset function tests and nonconformity removal procedure are performed so that the inspecting, sorting and statistic functions are completed.

11 Claims, 4 Drawing Sheets

INSPECTING SORTING MACHINE FOR FINISHED PRODUCTS OF PLASTIC FILM CAPACITOR

BACKGROUND OF THE INVENTION

Field of the Invention

The present invention relates to an inspecting sorting machine for finished products of plastic film capacitor, and more particularly to a machine which makes use of individual stations to perform tests and inspections in order to automatically choose the qualified capacitors conforming with the preset quality.

SUMMARY OF THE INVENTION

The quality of an electric product is dependent on the quality of whose parts. It is therefor a main object of the present invention to provide an inspecting sorting machine for finished products of plastic film capacitor, whose pressure resistance, capacity, consumption, insulation impedance and stability in using are able to be inspected and tested in advance prior to application to the electric products so that the product quality can be assured.

BRIEF DESCRIPTION OF THE DRAWINGS

The drawings disclose illustrative an embodiment of the present invention which serves to exemplify the various advantages and objects hereof, and are as follows.

DETAILED DESCRIPTION OF THE PREFERRED EMBODIMENT

Figure 1:
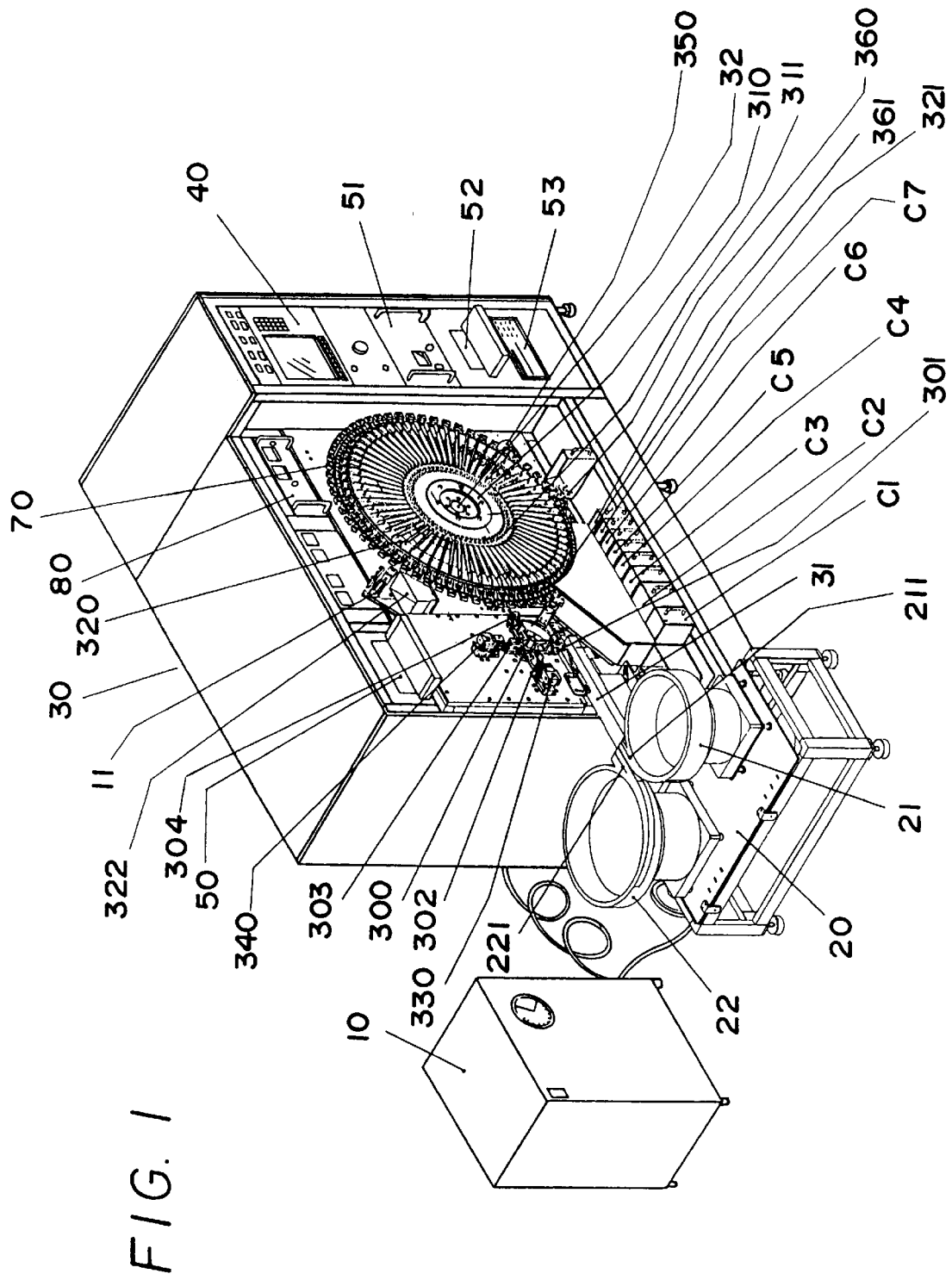
FIG. 1 is a perspective assembly view of the present invention.
Figure 2:
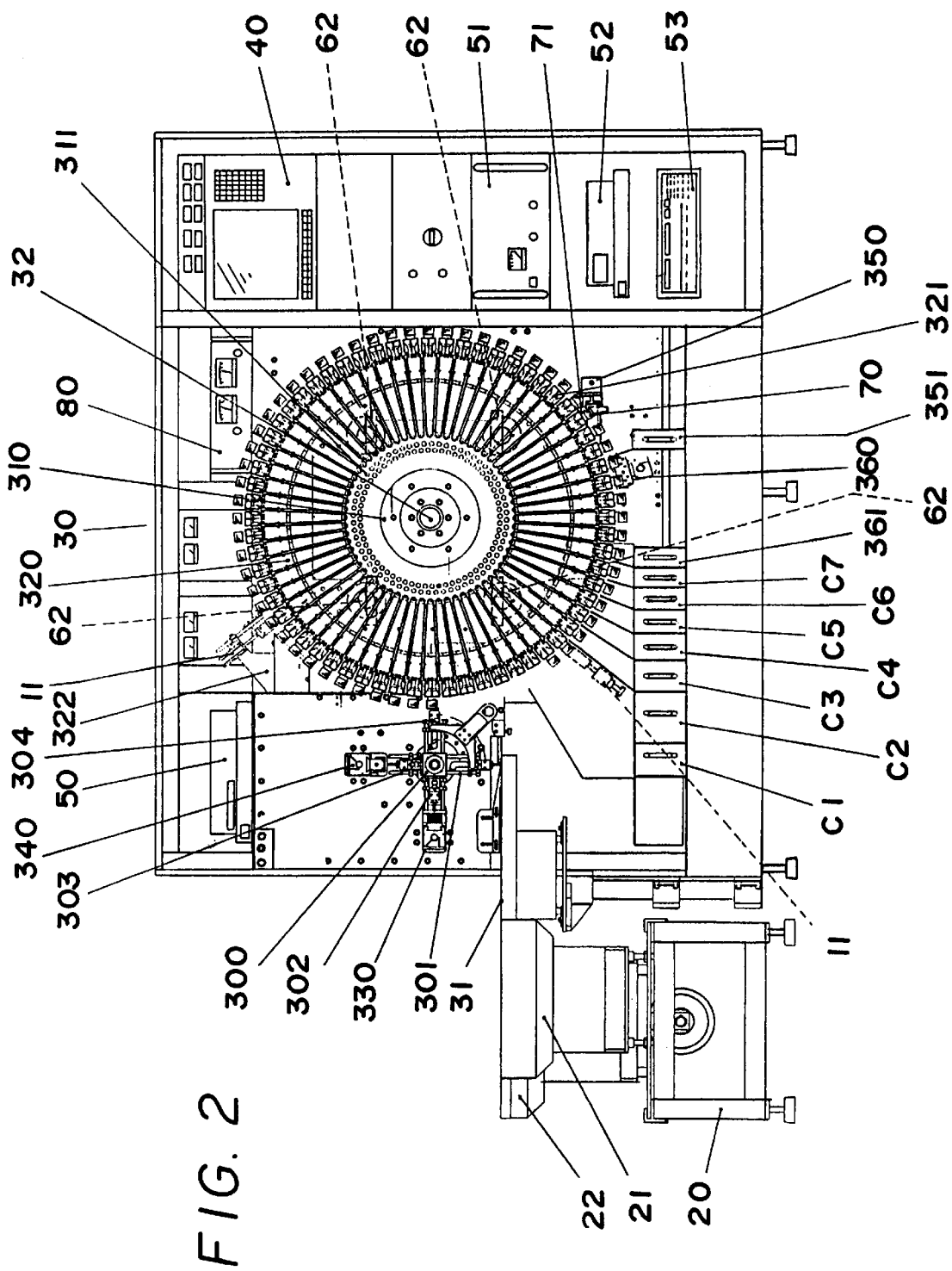
FIG. 2 is a plan view of the present invention.

First of all, referring to FIGS. 1 and 2, the inspecting sorting machine for finished products of plastic film capacitor in accordance with the present invention mainly includes a pneumatic pump 10, an automatic feeding table 20, an inspecting main machine 30, a central processing unit 40, a number of measuring gauges 50, 51, 52, 53, a charging and discharging power supply 80 and a motor transmission mechanism 60 (see FIG. 3), wherein the pneumatic pump 10 is used to coordinate with several pneumatic cylinders 11 for a number of material falling stations of the inspecting main machine 30 to force capacitors to fall down; onto the automatic feeding table 20 which has at least two electromagnetic vibration type automatic feeding plates 21, 22 so that capacitors 70 to be inspected are transported to a linear feeding unit 31 of the inspecting main machine 30; and the inspecting main machine 30 consists of a feeding plate 300 with four claws, a main testing plate 310, a fixture plate 320, a full foot mechanism 330, a predicting mechanism 340, a insulation impedance testing point 350 and a high low frequency capacity consumption testing mechanism 360 which are all driven by the motor transmission mechanism 60 mounted behind the inspecting main machine 30. After capacitors 70 pass through the linear feeding unit 31 and successively enter the feeding plate 300 with four claws and the fixture plate 320, a serial of preset function tests and nonconformity removal procedure will then be performed so that the inspecting, sorting and statistic functions will be fulfilled.

Figure 3:
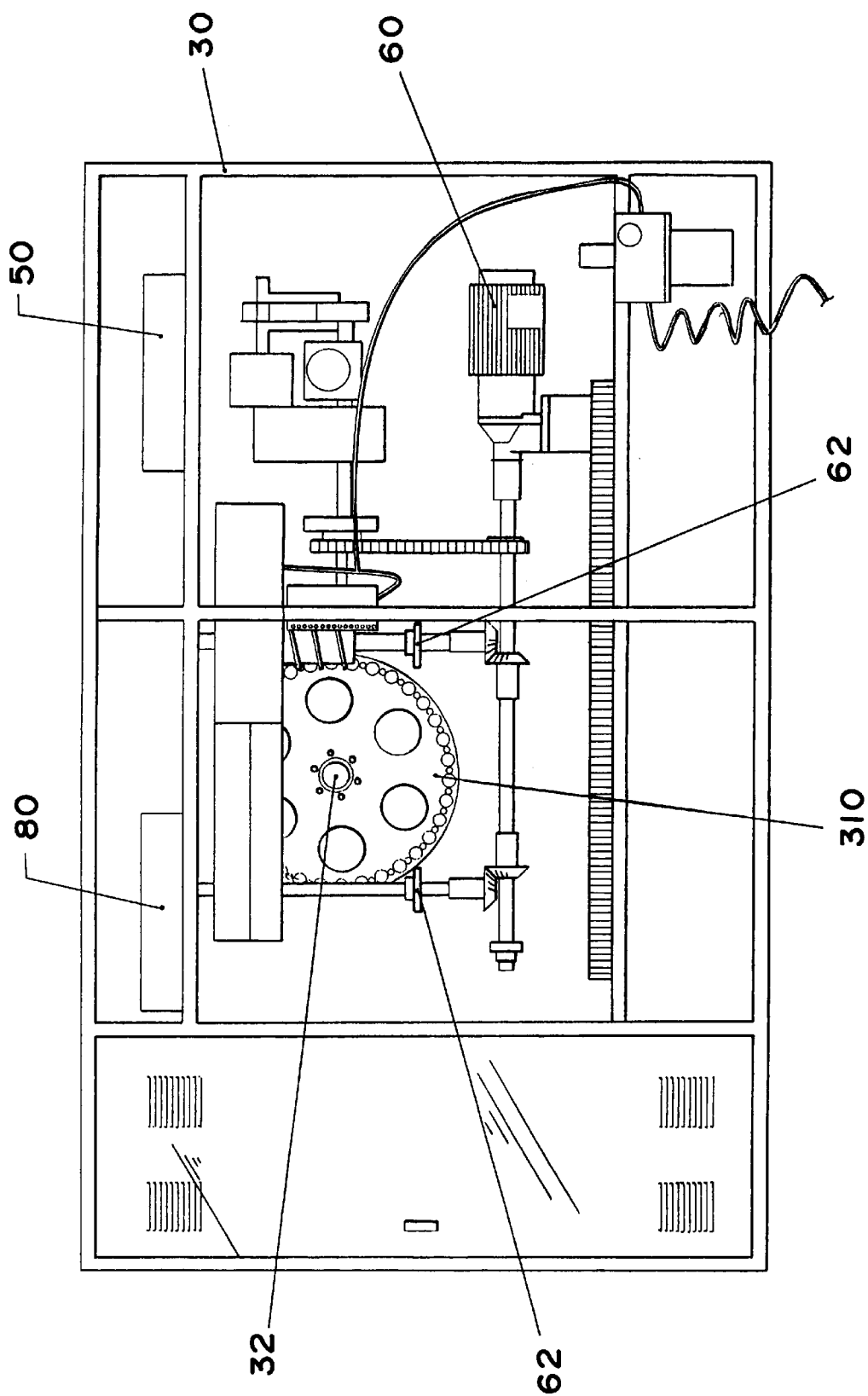
FIG. 3 is a plan view of the motor transmission mechanism of the present invention.

Referring to FIG. 3, the feeding plate 300 with four claws is activated by the motor transmission mechanism 60 so that an interrupted rotation of 90° angle is performed in the original position. When any feeding claw 301 is located in the position of the linear feeding unit 31, an automatic action to clamp a capacitor 70 will be done. When any feeding claw 302 is situated in the position of the full foot mechanism 330, two connecting feet 71 of the capacitor 70 will be corrected in position by the full foot mechanism 330 so that the two connecting feet 71 won't be bent or extended outwards in order to successfully enter into the fixture 321 of the fixture plate 320 later. When any feeding claw 303 is situated in the position of the predicting mechanism 340, the capacity and the consumption of the capacitor 70 will be tested in advance and the test results will then be shown in coordination with the corresponding measuring gauges 50. Provided that nonconformity is tested, the nonconforming product will be forced at said nonconformity material-falling station of said main testing plate to fall down to the nonconformity collection box 322 for a centralized improvement. When any feeding claw 304 is situated on one side of the fixture plate 320, the feeding procedure will be done by clamping actions of the fixture 321 of the fixture plate 320.

The fixture plate 320 is activated by the motor transmission mechanism 60 so that an interrupted rotation with a smaller stroke is able to be performed in the original position and whose edge has a number of fixtures 321 in order to stabilize and clamp the two connecting feet 71 of the capacitor 70.

The main testing plate 310 and the fixture plate 320 are situated on the same spindle 32 whose diameter is smaller than that of the fixture plate 320 whose rear end is pushed against a cam 62 so that a forward stretching out and a backward drawing back movement are able to be done in original position. Besides, countless corresponding power connecting points 311 are fitted in the position of the fixture 321 of the fixture plate 320 opposite to the edge thereof in order to connect to a testing circuit. Accordingly, when the main testing plate 310 moves forwards to touch the fixture plate 320, each power connecting point 311 is connected to the corresponding circuit (not shown) of the fixture plate 320 and each individual testing station is formed. Each testing station is preset. Thus, after the fixture 321 of the fixture plate 320 reaches a certain testing station, preset tests or operations to the capacitors 70 on the fixture 321 will then be performed (at material-falling stations for the predicted nonconformity, for nonconformity of the insulation impedance and at countless sorting material-falling stations after tests). After tests, the main testing plate 310 will be drawn back and separated from the fixture plate 320 so that the testing circuit will be temporarily interrupted. Then the fixture plate 320 will be rotated with a preset stroke and repeats the above testing steps of stretching out the main testing plate 310.

Each of the above mentioned material-falling stations for the predicted nonconformity, for nonconformity of the insulation impedance and countless sorting material-falling stations after tests individually has its own corresponding pneumatic cylinder 11 to open the fixture 321 so that the capacitors 70 are able to fall down into the corresponding collection boxes 322, 351, 361, C1 C2, C3, C4, C5, C6, C7. Most of the pneumatic cylinders 11 are situated behind the fixture plate 320 so that it is difficult to illustrate them in Figures; otherwise, the overall figures will be destroyed. Therefore, only one pneumatic cylinder 11 is drawn to represent them.

The tested objects of each testing stations of the above mentioned main testing plate 310 are preset in the central processing unit 40. The control programming isn't within the claim of this invention so that it won't be detailed herein.

The charging and discharging power supply 80 is used to repeat charging and discharging steps for tested capacitors 70 in several testing stations to simulate the real using state of capacitors 70 for completing their aging testing steps. Provided that there are nonconformity tested, it will be forced to fall down at the material-falling station of the main testing plate 310 and to enter into a certain collection box C6 for centralized improvement.

The insulation impedance testing point 350 is fitted in coordination with the measuring gauge 51 to perform this test for every capacitor 70, and the testing results and the statistic value will be shown. Provided that the value of the insulation impedance of a certain capacitor 70 is tested to be nonconforming with the preset one of that, it will be forced to fall down at the material-falling station for insulation impedance nonconformity and to enter into the nonconformity collection box 351 for centralized improvement.

The high low frequency capacity consumption testing mechanism 360 is fitted in coordination with the measuring gauges 52, 53 to be fastened at the high frequency consumption testing station 360 of the main testing plate 310 in order to perform this test for every capacitor 70, and the testing results and the statistic value will be shown. Provided that the value of the high frequency consumption rate of a certain capacitor 70 is tested to be higher than the preset value of that, it will be forced to fall down at the sorting material-falling station and to enter into a certain collection box 351.

At last, after each test to capacitors 70 is completed, the central processing unit 40 will individually force the capacitors 70 at the sorting material-falling station to fall down to the corresponding certain collection boxes C1 C2, C3, C4, C5, C6, C7 in accordance with the testing results to directly complete the sorting operation.

The above mentioned collection boxes C1 C2, C3, C4, C5, C6, C7 are positioned according to the sorting and separation purposes after the capacitors 70 are tested so that the different class of the capacitors 70 after testing is able to be individually collected.

Provided that a testing step for a certain capacitor 70 is lost due to power failure or other factors, the capacitor 70 will be forced at the sorting material-falling station to fall down to the collection box C7 for re-testing.

A number of testing stations formed by the above mentioned fixture plate 320 and main testing plate 310 are able to perform not only pre-test, insulation impedance test, high low frequency capacity consumption test and aging test, but also a few professional inspecting tests, including alternating pressure-resistant test, dielectric strength test and others.

Figure 4:
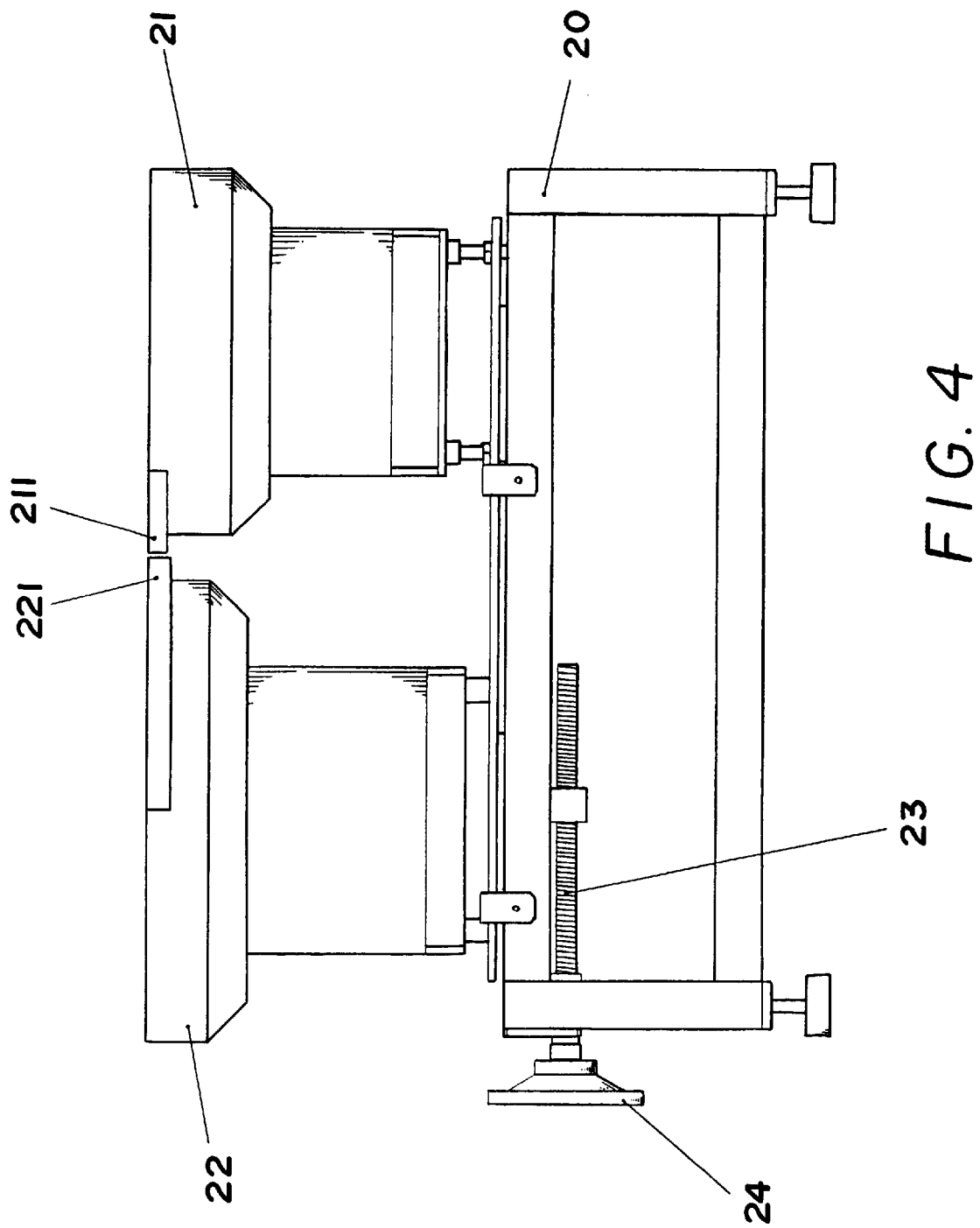
FIG. 4 is a plan view of the automatic feeding table of the present invention.

As shown in FIG. 4, there is a movement spiral shaft mechanism 23 under the automatic feeding table 20 so that the automatic feeding table 20 is able to be laterally shifted rightwards and leftwards by users by turning the handwheel 24 and the aim of the automatic feeding is able to be achieved by means that any electromagnetic vibration type automatic feeding plate 21, 22 is aligned with the linear feeding unit 31 of the inspecting main machine 30. Capacitors 70 with different specification and dimension can be placed into the electromagnetic vibration type automatic feeding plates 21, 22 to meet the practical requirement. Moreover, the electromagnetic vibration type automatic feeding plates 21, 22 are the conventional automatic feeding mechanism so that they won't be described herein as well.

Many changes and modifications in the above-described embodiment of the invention can, of course, be carried out without departing from the scope thereof. Accordingly, to promote the progress in science and the useful arts, the invention is disclosed and is intended to be limited only by the scope of the appended claims.

I claim:

1. An inspecting sorting machine for plastic film capacitors comprising a plurality of pneumatic cylinders and a pneumatic pump for coordinating said plurality of pneumatic cylinders, an automatic feeding table and an inspecting main machine including a linear feeding unit disposed adjacent to said automatic feeding table, a central processing unit, a number of measuring gauges and a charging and discharging power supply for charging and discharging capacitors disposed in said inspecting main machine and a motor transmission mechanism mounted behind said inspecting main machine, wherein said pneumatic pump is used to coordinate with several pneumatic cylinders for a number of material-falling stations of said inspecting main machine to force capacitors to fall down, said automatic feeding table having at least two electromagnetic vibration type automatic feeding plates so that capacitors to be inspected are transported to said linear feeding unit of said inspecting main machine; and said inspecting main machine consists of a feeding plate with four claws, a main testing plate, a fixture plate, a full foot mechanism, a predicting mechanism, an insulation impedance testing point and a high low frequency capacity consumption testing mechanism which are all driven by said motor transmission mechanism mounted behind said inspecting main machine; and characterized in that after capacitors pass through said linear feeding unit and successively enter said feeding plate with four claws and said fixture plate, a series of preset function tests and nonconformity removal procedure are performed so that the inspecting, sorting and statistic functions will be completed.

2. The inspecting sorting machine as claimed in claim 1, wherein said feeding plate with four claws is activated by said motor transmission mechanism so that an interrupted rotation of 90° angle is performed in the original position; when any feeding claw is located in the position of said linear feeding unit, an automatic action to clamp a capacitor will be done; when any feeding claw is situated in the position of said full foot mechanism, two connecting feet of said capacitor will be corrected in position by said full foot mechanism so that said two connecting feet won't be bent or extended outwards in order to successfully enter into said fixture of said fixture plate later; when any feeding claw is situated in the position of said predicting mechanism, the capacity and the consumption of said capacitor will be tested in advance and the test results will then be shown in coordination with said corresponding measuring gauges; provided that nonconformity is tested, said nonconforming product will be forced at said nonconformity material-falling station of said main testing plate to fall down to the nonconformity collection box for a centralized improvement; when any feeding claw is situated on one side of said fixture plate, the feeding procedure will be done by clamping actions of said fixture of said fixture plate.

3. The inspecting sorting machine as claimed in claim 1, wherein said fixture plate is activated by said motor transmission mechanism so that an interrupted rotation with a smaller stroke is able to be performed in the original position, and whose edge has a number of fixtures in order to stabilize and clamp said two connecting feet of said capacitor.

4. The inspecting sorting machine as claimed in claim 1, wherein said main testing plate and said fixture plate are situated on a spindle whose diameter is smaller than that of said fixture plate whose rear end is pushed against a cam so that a forward stretching out and a backward drawing back movement are done and countless corresponding power connecting points are fitted in the position of said fixture of said fixture plate opposite to the edge thereof in order to connect to a testing circuit; accordingly, when said main testing plate moves forwards to touch said fixture plate, each power connecting point is connected to said corresponding circuit of said fixture plate and each individual testing station is formed; and each testing station is preset; thus, after said fixture plate reaches a certain testing station, preset tests or operations to capacitors on the fixture will be performed; after tests, said main testing plate will be drawn back and separated from said fixture plate so that the testing circuit will be temporarily interrupted; then, said fixture plate will be rotated with a preset stroke and repeats the above testing steps of stretching out said main testing plate.

5. The inspecting sorting machine as claimed in claim 1, wherein said charging and discharging power supply is used to repeat charging and discharging steps for tested capacitors in several testing stations.

6. The inspecting sorting machine as claimed in claim 1, wherein said insulation impedance testing point of said inspecting main machine is fitted in coordination with said measuring gauge to perform this test for every capacitor, and the testing results and the statistic value will be shown; provided that the value of the insulation impedance of a certain capacitor is tested to be nonconforming with the preset one of that, it will be forced to fall down at the material-falling station for insulation impedance nonconformity and to enter into the nonconformity collection box for centralized improvement.

7. The inspecting sorting machine as claimed in claim 1, wherein said high low frequency capacity consumption testing mechanism of said inspecting main machine is fitted in coordination with said measuring gauges to be fastened at said high frequency consumption testing station of said main testing plate in order to perform this test for every capacitor, and the testing results and the statistic value will be shown; provided that the value of the high frequency consumption rate of a certain capacitor is tested to be higher than the preset value of that, it will be forced to fall down at the sorting material-falling station and to enter into a certain collection box.

8. The inspecting sorting machine as claimed in claim 1, wherein, after each test to capacitors is completed, said central processing unit will individually force said capacitors at the sorting material-falling station to fall down to the corresponding certain collection boxes in accordance with the testing results to directly complete the sorting operation, and each box is positioned according to the sorting and separation purposes after said capacitors are tested so that the different class of said capacitors after testing is able to be individually collected.

9. The inspecting sorting machine as claimed in claim 1, wherein a certain capacitor will be forced at the sorting material-falling station to fall down to the collection box for re-testing, provided that a testing step for said capacitor is lost due to power failure or other factors.

10. The inspecting sorting machine as claimed in claim 1, wherein a number of testing stations formed by said fixture plate and said main testing plate are able to perform not only pre-test, insulation impedance test, high low frequency capacity consumption test and aging test, but also a few professional inspecting tests, including alternating pressure-resistant test, dielectric strength test and others.

11. The inspecting sorting machine as claimed in claim 1, which includes a handwheel wherein there is a movement spiral shaft mechanism under said automatic feeding table so that said automatic feeding table is able to be laterally shifted rightwards and leftwards by users by turning the handwheel and the aim of the automatic feeding tube is achieved by means that any electromagnetic vibration type automatic plate is aligned with said linear feeding unit of said inspecting main machine.

* * * * *